United States Patent
Stancil

(10) Patent No.: US 7,149,927 B2
(45) Date of Patent: Dec. 12, 2006

(54) USE OF SMBUS TO PROVIDE JTAG SUPPORT

(75) Inventor: Charles J. Stancil, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 986 days.

(21) Appl. No.: 10/126,856

(22) Filed: Apr. 19, 2002

(65) Prior Publication Data

US 2003/0198185 A1    Oct. 23, 2003

(51) Int. Cl.
*G06F 11/00* (2006.01)

(52) U.S. Cl. .......................... 714/31; 714/30

(58) Field of Classification Search .............. 714/30, 714/31
See application file for complete search history.

(56) References Cited

U.S. PATENT DOCUMENTS

| | | | | |
|---|---|---|---|---|
| 5,933,614 A | * | 8/1999 | Tavallaei et al. | 710/306 |
| 6,363,452 B1 | * | 3/2002 | Lach | 710/316 |
| 2004/0225783 A1 | * | 11/2004 | Erickson et al. | 710/200 |

OTHER PUBLICATIONS

*IEEE Std 1149.1 (JTAG) Testability*, Texas Instruments, 1997 Semiconductor Group (42 p.).

* cited by examiner

*Primary Examiner*—Michael Maskulinski

(57) ABSTRACT

An emulator is provided on an electronic assembly that permits external logic to communicate with test logic on the electronic assembly over an electrical interface that has fewer signals than the electrical interface associated with the test logic itself. In this way, external logic can communicate with test logic on the electronic assembly over an interface that uses fewer signal lines thereby permitting the electronic assembly's electrical connector to be smaller than it otherwise would be. In accordance with one embodiment, the test logic's interface comprises a JTAG interface having four signals (with an optional fifth signal) and the interface between the emulator and the external logic comprises a two wire SMBus communication link. In fact, the SMBus interface may already be provided to the electronic assembly for other reasons such as to provide control to and obtain status information from another component on said electronic assembly.

23 Claims, 4 Drawing Sheets

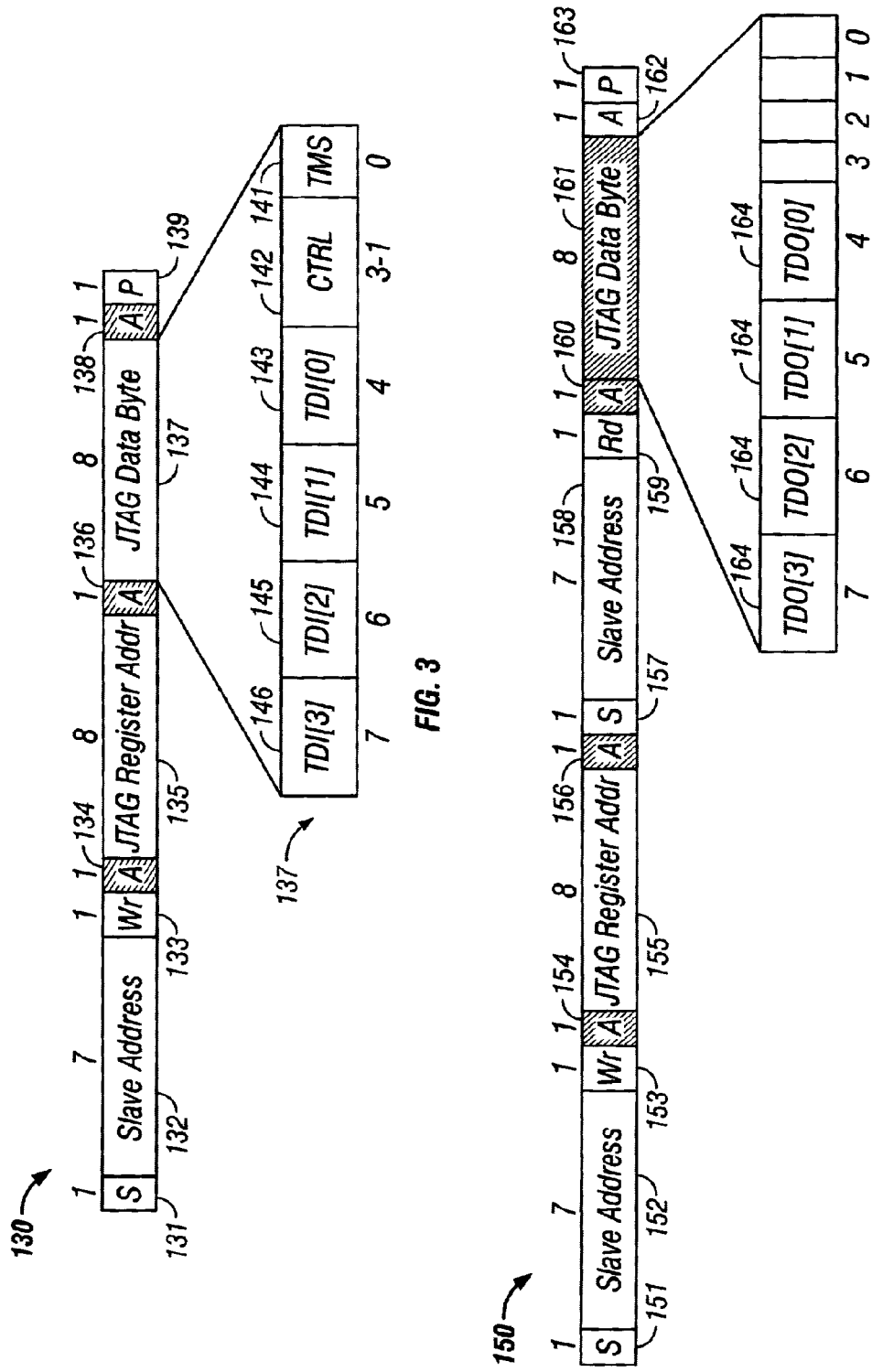

USE OF SMBUS TO PROVIDE JTAG SUPPORT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to providing test capabilities to an electronic component. More particularly, the invention relates to providing JTAG test capabilities to an electronic component without the use of standard JTAG input/output pins. Still more particularly, the invention relates to an SMBus-to-JTAG emulator to permit a host test system to communicate with the JTAG test port on an electronics assembly using the SMBus.

2. Background Information

It is desirable to test a piece of electronics equipment before it enters the stream of commerce. In the computer arts, the entire computer system is tested as well as various sub-systems contained therein such as add-in cards, displays, and the like. Generally, testing may include verifying the interconnection between components as well as verifying the functionality of various components and sub-subsystems.

More recently, the Institute of Electrical and Electronics Engineering has promulgated an industry test standard designated as IEEE Std 1149.1. This standard, also referred to as the Joint Test Action Group ("JTAG"), is a common protocol and boundary-scan architecture intended to be incorporated into application specific integrated circuits ("ASIC"), add-in cards and the like. In accordance with the JTAG test standard, an add-in card must include certain logic to enable the testing protocols. The JTAG standard also requires a minimum of four signal lines, and an optional fifth signal line, for its implementation. The five signal lines include a serial data input line, a serial data out line, a clock signal, a mode signal and an optional reset signal. Thus, a JTAG-compatible add-in card must dedicate four or five pins on its connector for JTAG testing.

It is generally desirable to have fewer, rather than more, pins on a card connector. Larger connectors occupy more space that can be at a premium in a computer system, particularly in notebook computers. Further, each pin on a connector is susceptible to breaking or otherwise malfunctioning. Thus, fewer pins generally results in a lower probability of connector failure. Accordingly, it would be desirable to provide the benefit of JTAG testing to an add-in card without the increase in pin count that is necessitated by JTAG's implementation.

BRIEF SUMMARY OF THE PREFERRED EMBODIMENTS OF THE INVENTION

The problems noted above are solved in large part by providing an emulator to an electronic assembly, such as an add-in card, that permits external logic, such as the host computer system or a dedicated host test system, to communicate with test logic on the electronic assembly over an electrical interface that has fewer signals than the electrical interface associated with the test logic itself. In this way, external logic can communicate with test logic on the electronic assembly over an interface that uses fewer signal lines thereby permitting the electronic assembly's electrical connector to be smaller than it otherwise would be.

In accordance with one embodiment, the test logic's interface comprises a JTAG interface having four signals (with an optional fifth signal) and the interface between the emulator and the external logic comprises a two wire SMBus communication link. In fact, the SMBus interface may already be provided to the electronic assembly for other reasons such as to provide control to and obtain status information from another component on said electronic assembly.

These and other aspects of the present invention will become apparent upon analyzing the drawings, detailed description and claims, which follow.

BRIEF DESCRIPTION OF THE DRAWINGS

For a detailed description of the preferred embodiments of the invention, reference will now be made to the accompanying drawings in which:

FIG. 3 shows a preferred test write transaction between a host test system and the device under test;

FIG. 4 shows a preferred test read transaction between a host test system and the device under test.

NOTATION AND NOMENCLATURE

Certain terms are used throughout the following description and claims to refer to particular system components. As one skilled in the art will appreciate, computer companies may refer to a component and sub-components by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either a direct or indirect electrical connection. Thus, if a first device couples to a second device, that connection may be through a direct electrical connection, or through an indirect electrical connection via other devices and connections. In addition, no distinction is made between a "processor," "microprocessor," "microcontroller," or "central processing unit" ("CPU") for purposes of this disclosure. To the extent that any term is not specially defined in this specification, the intent is that the term is to be given its plain and ordinary meaning.

DETAILED DESCRIPTION OF THE PREFERRED EMBODIMENTS

Figure 1:
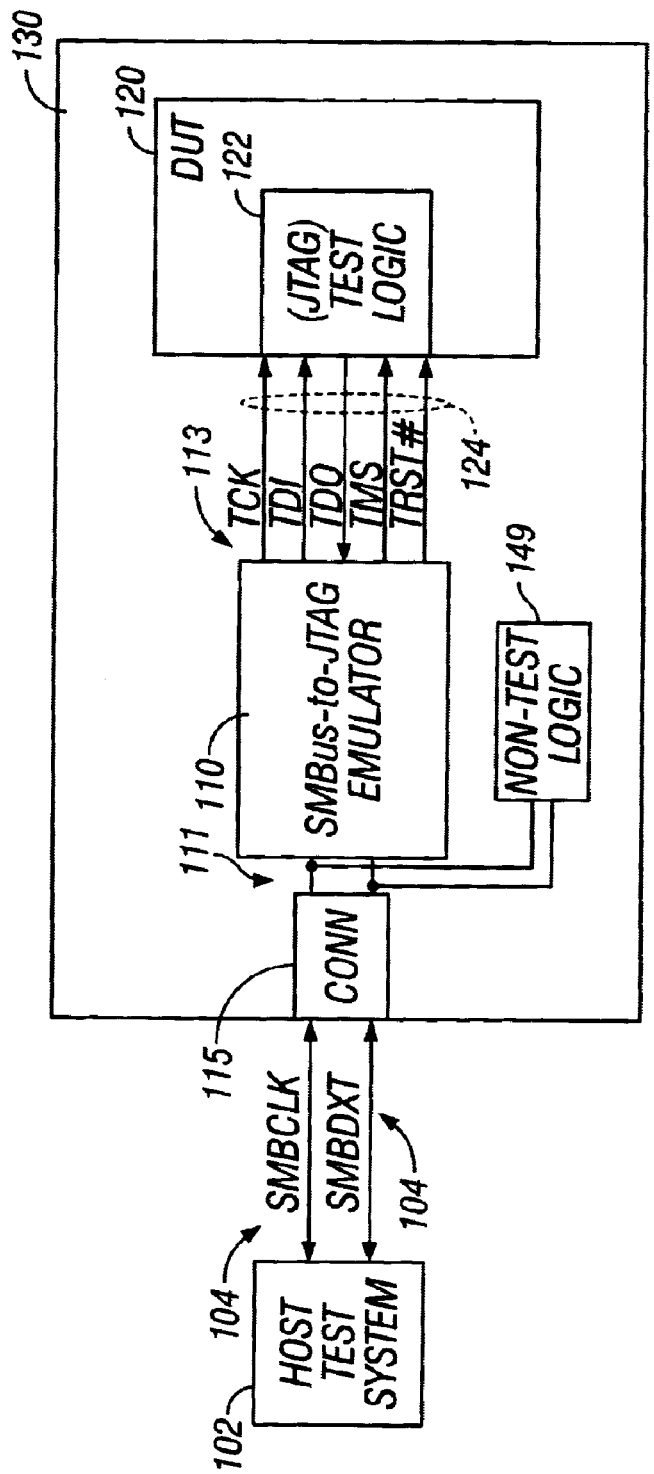
FIG. 1 shows a preferred embodiment of the invention comprising an emulator to provide an interface to the JTAG test logic for a device under test.

Referring now to FIG. 1, in accordance a preferred embodiment a device under test ("DUT") 120 couples to a host test system 102 via an emulator 110. The DUT 120 may be an add-in card for a computer system, an integrated circuit (e.g., an ASIC), or any other type of electronic device for which testing is desirable. In the embodiment depicted in FIG. 1, the DUT 120 is intended to represent an ASIC provided on a circuit card 130. As shown, the emulator also is provided on the circuit card 130. The function performed by the DUT is not significant to the scope of this disclosure.

The DUT is simply an electronics device that performs some function and can be tested. Thus, the DUT 122 includes other functional logic (not specifically shown).

The testing of the DUT may be conducted in a number of ways. As shown in FIG. 1, the circuit card 130 is being tested by coupling the card to a host test system 102 whose purpose is to test the card 130. Alternatively, the card 130 can be tested by the electronics equipment for which it was designed. Accordingly, if the card 130 represents an add-in card for a computer system, then the computer system could be used to test the card. Broadly, the host test system 102 is any logic that can communicate through the emulator 110 to test the DUT 120.

Referring still to FIG. 1, the DUT 120 preferably includes test logic 122 which functions to provide a testing capability to the DUT. In accordance with a preferred embodiment, test logic 122 comprises JTAG test logic in accordance with the IEEE Std 1149.1. As discussed previously, the JTAG standard provides for four or five signal lines 124 to implement the protocol. Those signal lines are as shown in FIG. 1 as the test clock signal ("TCK"), the test data input signal ("TDI"), the test data output signal ("TDO"), the test mode sense input signal ("TMS") and the optional test reset signal ("TRST#").

The functions performed by each of the JTAG signals 124 are not significant to the scope of this disclosure. Nevertheless, the following discussion provides a general overview of the JTAG signal interface. A more complete discussion can be found in numerous references such as the "IEEE 1149.1 (JTAG) Testability Primer," incorporated herein by reference. The TDI input signal is used to provide a predetermined serial test pattern to the DUT and the TDO output signal provides the output test results from the DUT. The TCK signal is used to clock in and out the input and output test data. The TMS signal is used to specify the type of scan mode performed by the JTAG logic 122. In general, the JTAG logic permits test data to be clocked onto the I/O pins (not specifically shown) of the DUT to test the functionality of the DUT as well as to test the interconnections between the DUT 120 and other devices on the circuit card 130. As noted above, the TDI input data comprises a serially clocked in stream of test data with one bit being clocked in by the JTAG logic 122 on each rising edge of TCK. The TRST# is used to cause the test logic 122 to transition to a known initialized state.

In accordance with the preferred embodiment of the invention, although the DUT uses the JTAG test protocol which specifies the inclusion of 4 (or 5) test-specific signals, the JTAG logic 122 on the DUT is accessed and exercised without external access to the JTAG signals 124. That is, host test system 102 communicates with the DUT JTAG test logic 122 without direct access to the JTAG signals 124. Instead, the host test system 102 preferably accesses the JTAG logic 122 using another set of signals that preferably, but not necessarily, is already present on the circuit card 130. In accordance with one preferred embodiment, and the embodiment shown in FIG. 1, this other set of host test system-accessible signals includes SMBus signals 104. The SMBus is another industry standard electrical interface that comprises two signals—SMBCLK and SMBDAT—as shown. The SMBus thus is a two-wire, low bandwidth, serial bus typically used for monitoring status of various computer subsystems, such as smart batteries, temperature sensors.

In accordance with the preferred embodiment of FIG. 1, the SMBus is also provided to the circuit card 130 for reasons unrelated to testing the DUT 120, such as to provide access to other logic, such as logic 149, on card 130 for non-test purposes. In addition, however, the SMBus can be used to communicate with the JTAG logic 122 associated with the DUT 120. The emulator 110 thus preferably provides two interfaces—an SMBus interface 111 and a JTAG interface 113 and converts SMBus communications to JTAG communications and vice versa. As such, the emulator 110 is referred to as a "SMBus-to-JTAG emulator." The term "emulator" is not intended to impart any limitations other than conversion between SMBus and JTAG. Other suitable terms for logic 110 include a "bridge" or a "converter."

By using the SMBus, which preferably is already present to/from the circuit card 130, the circuit card 130 need not provide the 4 (or 5) JTAG signals to its connector 115. This advantageously reduces the pin count, and thus size, of connector 115 and the potential for signal or pin failure discussed above.

Figure 2:
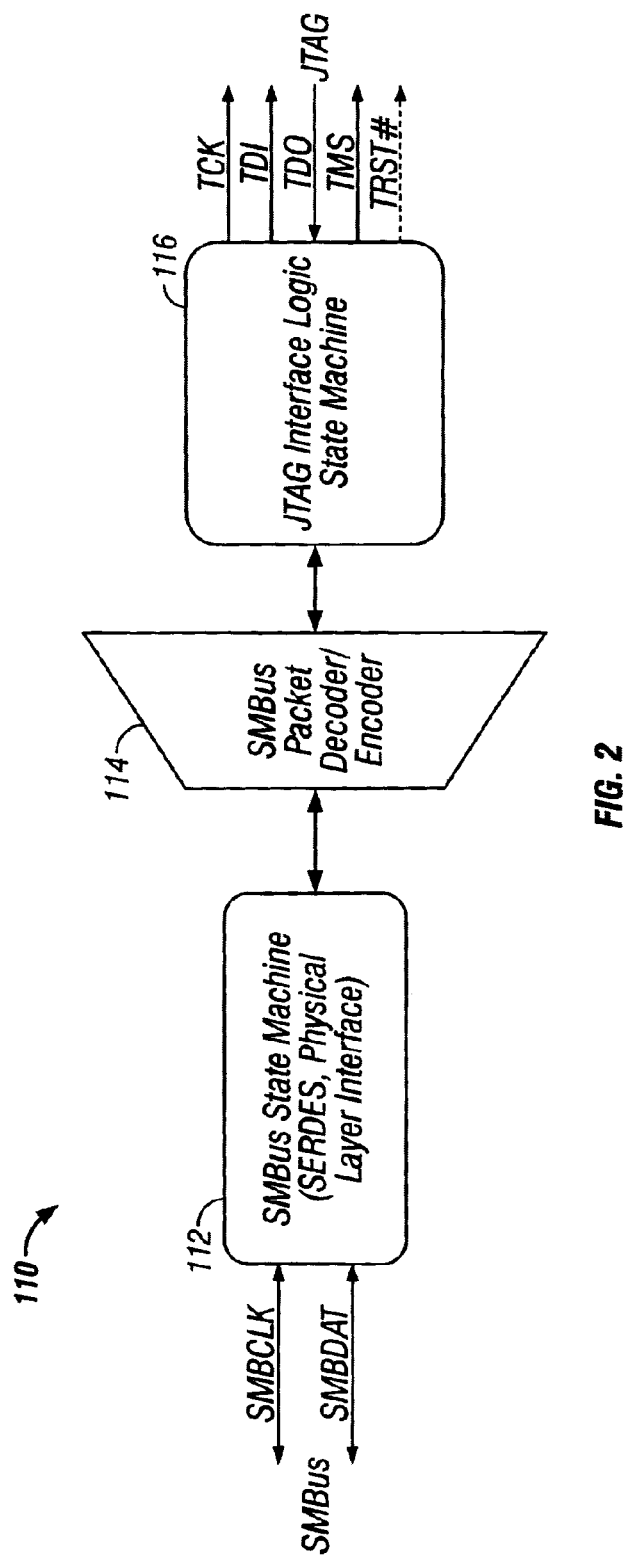
FIG. 2 shows a block diagram of the preferred embodiment of the emulator depicted in FIG. 1.

FIGS. 2–5 provide further detail regarding SMBus-to-JTAG emulator 110 pertaining to how the emulator converts between SMBus and JTAG. A more detailed block diagram of emulator 110 is shown in FIG. 2. As shown therein, the emulator 110 preferably comprises an SMBUs state machine 112, an SMBus packet decoder/encoder 114 and a JTAG interface logic state machine 116. The SMBus state machine 112 comprises logic that receives SMBus packets from the host test system 102 and, with the help of the SMBus packet decoder/encoder 114, extracts the information from the packets necessary for the JTAG logic 122. The decoder/encoder 114 then creates JTAG-compliant communications that are sent to the JTAG logic 122 associated with the DUT 120 under the control of the JTAG interface logic state machine 116. Similarly, JTAG communications from the JTAG logic 122 are received by state machine 116, decoded by decoder/encoder 114 and are converted to SMBus-compliant packets by decoder/encoder 114 and provided to the host test system 102 under the control of the SMBus state machine 112.

FIG. 3 depicts a suitable write transaction from the host test system 102 to the emulator 110 via the SMBus signals 104. As noted above, the SMBus is a serial bus and the communicated bits depicted in the transaction of FIG. 3 thus are serially transmitted between the host test system and the emulator over the SMBDAT signal wire. The write transaction 130 is used by the host test system 102 to initiate a test sequence, to transmit a test pattern and to place the JTAG logic 122 into a particular scan mode of operation.

The write transaction 130 begins with the host test system 102 transmitting a start condition (S) 131 followed by a seven bit slave address 132 and a read/write bit 133 indicating a write transaction is to be performed. The slave address 132 is an SMBus-related address associated with the circuit card 130. The slave address is predetermined and made available to the software developed. Moreover, all SMBus write and read transactions associated with the JTAG logic 122 include the same slave address. If the emulator 110, which is programmed with the slave address of the card 130, successfully detects the start condition 131, determines that the slave address of the SMBus message is the address of card 130 and successfully receives and decodes the write bit 133, the emulator 110 responds to the host test system 102 with an acknowledge condition (A) 134. The acknowledge condition 134 informs the host test system 102 that the emulator has correctly detected the beginning of the write transaction.

The host test system 102 then provides an eight bit JTAG register address 135. The register address preferably is unique to the DUT 120, which also is programmed into the emulator 110. Upon successful decoding of the JTAG register address 135, the emulator 110 preferably again responds with an acknowledge condition 136. Up to this point, the host test system 102 has initiated the write transaction to the slave address associated with the card 130 and the JTAG register address associated with the DUT 120 and the emulator 110 has acknowledged that the requested write transaction is targeting the associated DUT 120.

Then, the host test system 102 transmits a multi-bit JTAG data value 137. In the embodiment of FIG. 3, the value 137 comprises one byte (i.e., eight bits), but it can be other than one byte such as two or more bytes. The data value 137 encodes the JTAG-specific write transaction information from the host test system 102 and will be explained below. Upon successful receipt of the value 137, the emulator 110 responds back with another acknowledge condition 138 and the host then signals the end of the write transaction 130 with a stop condition (P) 139.

The JTAG data value 137 is used to encode test data from the host test system 102 in accordance with any desirable technique. One suitable coding scheme is shown in FIG. 3 by way of the expanded JTAG data value 137. In this embodiment, the JTAG data value includes a TMS bit 141, a control field 142 (preferably 3 bits in length), and one or more TDI bits 143–146. As noted above, each JTAG test data input bit ("TDI") normally is latched in on a rising edge of the TCK. The JTAG data value 137 may include one or more TDI bits which the emulator 110 uses to generate and provide appropriately clocked serial TDI bits to the JTAG logic 122. The control field 142 indicates the number of TDI bits (and thus the number of TCK pulses) included in the data value 137. One encoding scheme for the control field 142 is shown below in Table I.

TABLE I

Control Field Encoding Scheme

| Control bits | Meaning |
| --- | --- |
| 000 | No TCK pulse |
| 001 | 1 TCK pulse |
| 010 | 2 TCK pulses |
| 011 | 3 TCK pulses |
| 100 | 4 TCK pulses |
| 101 | Undefined |
| 110 | Undefined |
| 111 | TRST# assertion |

If it is desired to provide more than four TDI bits in the JTAG data value 137, the control field can be expanded to include more than 3 bits to encode more than four TDI bits with, of course, an increase in the number of TDI bits (or at least use the two undefined control field encoded values). The control field value of "111" indicates that the TRST# signal should be asserted to the JTAG Also, the JTAG data value 137 includes a TMS bit 141 which is used to perform a desired type of JTAG boundary scan. The IEEE 1149.1 provides for data register scans and instruction register scans, which are described in greater detail in the "IEEE Std 1149.1 (JTAG) Testablity Primer." As such, the host test system 102 can also encode the TMS functionality into the SMBus write transaction 130.

FIG. 4 shows an exemplary embodiment of an SMBus packet 150 encoding a JTAG read command. The packet 150 begins with a start condition 151 and a slave address 152 and write bit 153 as was the case of the write command 130 in FIG. 3. The emulator 110 then responds with an acknowledge condition 154 and the host test system 102 provides a JTAG register address 155. The emulator provides another acknowledge condition 156. Thus far, the communication protocol is the same as was described above with regard to FIG. 3.

The host test system 102 then issues another start condition 157 followed by a slave address 158. This time, however, the host test system follows the slave address with a bit 159 that encodes a read bit, rather than a write bit. As such, read bit 159 preferably is of opposite logical polarity from write bit 153. Bits 147, 158 and 159 inform the emulator 110, and thus JTAG logic 122 that the host test system is requesting the JTAG logic 122 to provide one or more TDO bits. The emulator 110 responds to the host's read request with an acknowledge condition 160 and then a JTAG data value 161 comprising one or more TDO bits 164. The number and bit locations of the TDO bits 164 preferably is predetermined and made known to the software developer. The TDO bits in the data value 161 are provided by the JTAG logic 122 to the emulator across the TDO signal line shown in FIG. 1. Upon receipt of the requested TDO bit(s), the host test system 102 ends the transaction with a not acknowledge condition 162 and a stop condition 163.

Figure 5:
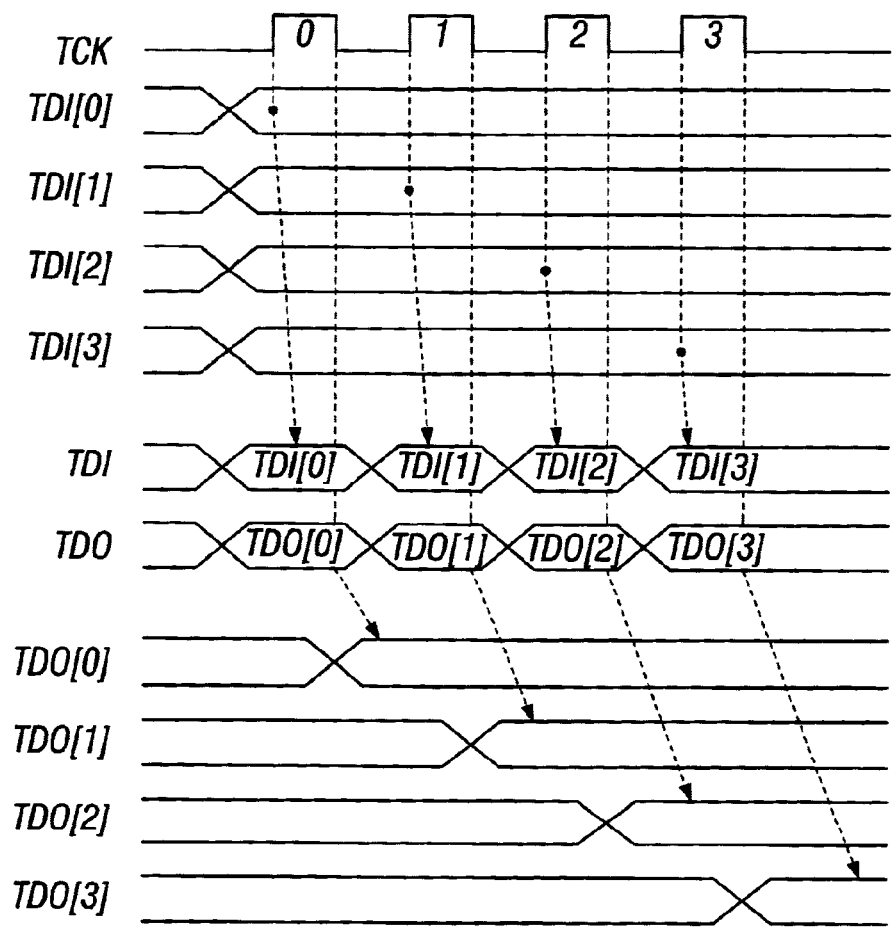
FIG. 5 shows a timing diagram.

FIG. 5 shows a timing diagram 200. The diagram shows a TCK signal followed by four TDI bits (TDI[0–3]), a TDI signal, a TDO signal and four TDO bits (TDO[0–3]). The TCK, TDI and TDO signals represent the serial signals shown in FIG. 1 that are asserted between the SMBus-to-emulator 110 and the JTAG logic 122. The TDI[n] and TDO[n] bits represent the encoded bits contained in the SMBus packets 130 and 150. In accordance with standard JTAG protocol, TDI bits are sampled and written to the JTAG logic 122 in accordance with the rising edge of the TCK pulses. Upon receipt of an SMBus packet 130 including one or more TDI bits 143–146 (FIG. 3), as specified by control field 142, the emulator asserts the TDI bits 143–146 on the TDI signal line to the JTAG logic 122 on each successive rising edge of TCK as shown.

Extracting TDO bits from the JTAG logic 122 occurs on the falling edge of TCK. Thus, each TCK pulse may result in providing a single TDI bit to the test logic and receiving a TDO bit from the test logic. The emulator samples the TDO signal line on the falling edges of TCK as shown.

As noted above, issuing an SMBus JTAG write command (130) with the control field 142 set to a binary value of "111" will cause the emulator 110 to assert the TRST# signal (preferably active low). The emulator 110 also preferably is capable of deasserting the TRST# signal. Any suitable method for causing the emulator 110 to deassert TRST# can be used. For example, another SMBus write command can again be issued with the control field 142 not set to a binary value of "111." Alternatively, when the host test system 102 issues the SMBus write command with a control field of "111" the emulator 110 will pulse TRST# for a specified period of time, and then automatically deassert it. That period of time may be predetermined or programmable.

The preferred embodiment described herein is directed to an add-in card with a device ("DUT") that includes JTAG test logic. The card includes an SMBus-to-JTAG emulator so that external hardware (e.g., host test system) can access and communicate with the JTAG capability of the device without direct physical access to JTAG signal lines. Instead, another communication link is used to permit external hardware access to the device's JTAG logic. Such other communication link preferably comprises a communication link that is provided on the add-in card for other purposes and can be used in connection with JTAG communications as well. Although the preferred embodiment describes the use of the SMBus in this regard, other communication links can be used as well such as the peripheral component interconnect ("PCI") bus. By not dedicating add-in card connector pins exclusively to JTAG use, the add-in card connector advantageously can be made smaller. This also results in a smaller probability of pin failure and other related failure mode possibilities (e.g., cold solder joints).

As described above, the JTAG logic 122 preferably comprises standard JTAG logic in accordance with conventional JTAG usage such as that described in the "IEEE Std 1149.1 (JTAG) Testablity Primer." The emulator thus advantageously provides the benefit of external logic being able to communicate with embedded JTAG logic without having to modify well-known JTAG test logic. Alternatively, however, the JTAG logic 122 included in the DUT 120 could be modified to include direct access to the SMBus (or other desired communication links). That is, the JTAG logic 122 could have a non-JTAG external electrical interface. The ability to redesign the JTAG logic 122 in this regard is readily within the abilities of one of ordinary skill in the art and would not require undue experimentation. This approach could also take advantage of the packet nature of SMBus to parallel load the JTAG registers and execute JTAG state transitions without using the TMS mechanism.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An electronic system, comprising:
   an electronic component comprising test logic;
   an emulator coupled to said test logic of said electronic component according to a first serial communication link; and
   a host test system coupled to said emulator according to a second serial communication link;
   wherein said first serial communication link is in accordance with a different communication protocol than said second communication link and said emulator converts communications between said first and second serial communication links; and
   wherein said emulator receives a communication packet from the host test system, said packet comprising a data value including a control field which encodes the number of serial data bits the emulator is to serially transmit to the test logic.

2. The system of claim 1 wherein said first serial communication link comprises a JTAG bus.

3. The system of claim 2 wherein said second serial communication link comprises an SMBus link.

4. The system of claim 1 wherein said second serial communication link comprises an SMBus link.

5. The system of claim 4 wherein said first serial communication link comprises a JTAG bus.

6. The system of claim 1 wherein said emulator receives communication packets from said host test system, said communication packets encoding information to be provided to said test logic over said first serial communication link.

7. The system of claim 1 wherein said packet also includes the serial data bits to be provided to the test logic.

8. The system of claim 7 wherein said emulator reads said control field and provides each of said serial data bits to said test logic on successive clock pulses of a clock signal coupling said emulator and said test logic.

9. The system of claim 1 wherein said packet also includes a mode bit to be provided to the test logic which effects the mode of operation of the test logic.

10. The system of claim 1 wherein said control field also encodes an indication of whether the emulator is to assert a reset signal to said test logic.

11. The system of claim 10 wherein said emulator deasserts said reset signal a predetermined period of time after asserting the reset signal.

12. The system of claim 10 wherein said host system causes said reset signal to be deasserted by issuing a command to said emulator over said second communication link which includes a value in said control field that is different than the value which caused the reset signal to be asserted.

13. An electronic system, comprising:
    an electronic component comprising test logic used to test said electronic component, said test logic accessible by a first electrical interface comprising m signals; and
    an emulator coupled to said test logic using via said first electrical interface, said emulator providing a second electrical interface to external logic via a second electrical interface comprising n signals;
    wherein n is less than m; and
    wherein said emulator receives a data value from the external logic, said data value encoding the number of serial data bits the emulator is to serially transmit to the test logic.

14. The system of claim 13 wherein said first electrical interface comprises a JTAG bus.

15. The system of claim 14 wherein said second electrical interface comprises an SMBus link.

16. The system of claim 13 wherein said second electrical interface comprises an SMBus link.

17. The system of claim 15 wherein said first electrical interface comprises a JTAG bus.

18. The system of claim 13 wherein said emulator receives communication packets from said host test system, said communication packets encoding information to be provided to said test logic over said first electrical interface.

19. The system of claim 13 wherein said packet also includes the serial data bits to be provided to the test logic.

20. The system of claim 19 wherein said emulator reads said control field and provides each of said serial data bits to said test logic on successive clock pulses of a clock signal coupling said emulator and said test logic.

21. The system of claim 13 wherein said packet also includes a mode bit to be provided to the test logic which effects the mode of operation of the test logic.

22. The system of claim 13 wherein said control field also encodes an indication of whether the emulator is to assert a reset signal to said test logic.

23. A method of communicating with test logic on an electronic component;
    (a) providing a communication packet to a bridge which couples to the test logic in said electronic component;
    (b) decoding said communication packet to extract a control field value which encodes the number of test data bits contained in the packet;
    (c) decoding said communication packet to extract the test data bits provided therein; and
    (d) outputting a serial stream of the test data bits to said test logic.

* * * * *